US011592005B2

(12) United States Patent
Mongeau et al.

(10) Patent No.: US 11,592,005 B2
(45) Date of Patent: Feb. 28, 2023

(54) STRAY CURRENT DETECTION IN WIND TURBINE GENERATORS

(71) Applicant: Vestas Wind Systems A/S, Aarhus N. (DK)

(72) Inventors: Peter Mongeau, Center Conway, NH (US); Nicolaj Olesen, Nørresundby (DK); Lars Brink Christensen, Skanderborg (DK); Marek Swies, Cracow (PL)

(73) Assignee: Vestas Wind Systems A/S, Aarhus N (DK)

( * ) Notice: Subject to any disclaimer, the term of this patent is extended or adjusted under 35 U.S.C. 154(b) by 0 days.

(21) Appl. No.: 17/312,732

(22) PCT Filed: Dec. 17, 2019

(86) PCT No.: PCT/DK2019/050403
§ 371 (c)(1),
(2) Date: Jun. 10, 2021

(87) PCT Pub. No.: WO2020/125899
PCT Pub. Date: Jun. 25, 2020

(65) Prior Publication Data
US 2022/0018337 A1 Jan. 20, 2022

Related U.S. Application Data

(60) Provisional application No. 62/783,279, filed on Dec. 21, 2018.

(30) Foreign Application Priority Data

Jan. 3, 2019 (DK) ........................... PA 2019 70005

(51) Int. Cl.
*F03D 17/00* (2016.01)
*F03D 9/25* (2016.01)
(Continued)

(52) U.S. Cl.
CPC ........... *F03D 17/00* (2016.05); *F03D 7/0272* (2013.01); *F03D 9/25* (2016.05); *G01R 15/181* (2013.01)

(58) Field of Classification Search
CPC .......... F03D 17/00; F03D 9/25; F03D 7/0272; G01R 15/181
See application file for complete search history.

(56) References Cited

U.S. PATENT DOCUMENTS

2012/0319678 A1   12/2012  Hassel et al.
2014/0320109 A1*  10/2014  Bankestrom ....... G01R 19/0092
                                              324/76.11

(Continued)

FOREIGN PATENT DOCUMENTS

CN    108594114 A    9/2018
EP    1996815 A1    12/2008
EP    2783195 A1    10/2014

OTHER PUBLICATIONS

Danish Patent and Trademark Office, Search and Examination Report in PA 2019 70005, dated Jun. 21, 2019.
(Continued)

*Primary Examiner* — Viet P Nguyen
(74) *Attorney, Agent, or Firm* — Wood Herron & Evans LLP

(57) ABSTRACT

An electrical power generating assembly (20) for a wind turbine (1). The electrical power generating assembly comprises a gearbox (22) comprising a gearbox output shaft, a generator (24) comprising a rotor (32) that is coupled to the gearbox output shaft; and a current measuring module (40) located between the gearbox (22) and the generator (24). The current measuring module (40) comprises: an electrical pickup (42) mounted to the electrical power generating assembly (20), wherein the electrical pickup (42) includes an electrical contact (44) that engages with a slip ring (48)

(Continued)

associated with the rotor (32). The current measuring module further comprises: a first current measuring device (50) mounted with respect to the electrical pickup (42) to detect current flowing at least through the electrical pickup; and a second current measuring device (52) mounted with respect to the electrical pickup (42) to detect current flowing through at least a component associated with the gearbox output shaft.

14 Claims, 6 Drawing Sheets

(51) Int. Cl.
*F03D 7/02* (2006.01)
*G01R 15/18* (2006.01)

(56) References Cited

U.S. PATENT DOCUMENTS

2014/0324236 A1   10/2014   Bankestrom
2017/0199232 A1    7/2017   Jahnke et al.
2018/0351439 A1*  12/2018   Jahnke ............... G05B 23/0235

OTHER PUBLICATIONS

European Patent Office, International Search Report and Written Opinion in PCT Application No. PCT/DK2019/050403, dated Mar. 13, 2020.

* cited by examiner

STRAY CURRENT DETECTION IN WIND TURBINE GENERATORS

TECHNICAL FIELD

The invention relates to a wind turbine generator equipped with an arrangement for monitoring stray currents through various components of that generator in order to provide diagnostics and protection.

BACKGROUND

Wind turbines convert kinetic energy from the wind into electrical energy, using a large rotor with a number of rotor blades. A typical Horizontal Axis Wind Turbine (HAWT) comprises a tower, a nacelle on top of the tower, a rotating hub or 'rotor' mounted to the nacelle and a plurality of wind turbine rotor blades coupled to the hub. The nacelle houses many functional components of the wind turbine, including for example a generator, gearbox, drive train and rotor brake assembly, as well as convertor equipment for converting the mechanical energy at the rotor into electrical energy for provision to the grid. The gearbox steps up the rotational speed of the low speed main shaft and drives a gearbox output shaft. The gearbox output shaft in turn drives the generator, which converts the rotation of the gearbox output shaft into electricity. The electricity generated by the generator may then be converted as required before being supplied to an appropriate consumer, for example an electrical grid distribution system.

In a wind turbine system, the generator necessarily generates high voltages, and this is particularly true for modern-day wind turbines which pursue high voltage generation for electrical efficiency. However, a challenge to the design of such generator assemblies is that the generated high voltages can also induce unintentional currents in other components of the generator and associated components. These so-called 'stray currents' can result in electrical arcing between adjacent components, and this can, in turn, cause damage such as pitting and welding. Bearings are particularly susceptible to this kind of damage and so it is desirable to detect that such 'stray currents' are within acceptable levels. It is also desirable to channel such currents along grounding routes that will not cause problems.

It is against this background that the invention has been devised.

SUMMARY OF THE INVENTION

According to a first aspect of the invention, there is provided an electrical power generating assembly for a wind turbine. The electrical power generating assembly comprises a gearbox comprising a gearbox output shaft, a generator comprising a rotor that is coupled to the gearbox output shaft; and a current measuring module located between the gearbox and the generator. The current measuring module comprises: an electrical pickup mounted to the electrical power generating assembly wherein the electrical pickup includes an electrical contact that engages with a slip ring associated with the rotor. The current measuring module further comprises: a first current measuring device mounted with respect to the electrical pickup to detect current flowing therethrough; and a second current measuring device mounted with respect to the electrical pickup to detect current flowing through a component associated with the gearbox output shaft.

The above-described assembly is advantageous as it enables diagnostics of stray current levels in various components of the electrical power generating assembly (and particularly in the generator components such as the rotor) to be easily carried out. Furthermore, the above-described assembly may be configurable to prevent excess build-up of stray currents by, for example, taking protective measures if the detected stray current in certain components exceeds a predetermined threshold. This advantageously helps to prevent damage to key turbine components that may result from electrical arcing caused by the stray currents.

Note that, preferably, the electrical pickup is stationary with respect to the rotor, in use, in the sense that the electrical pickup does not rotate with the rotor.

In a preferred embodiment of the invention, the current measuring module is provided as an integrated unit. Providing the current measuring module as an integrated unit, with all of the components being mounted together somehow to one unit prior to installation increases the ease of installation of the module in its desired location between the generator and gearbox.

In some embodiments, each of the first and second current measuring devices comprises an elongate sensing element arranged to substantially encircle the generator rotor. As the current measuring devices encircle the generator rotor, they are able to easily detect stray current that builds up at least within the rotor, but also anything electrically connected to it either capacitively or galvanically. Each of the first and second current measuring devices may comprise a Rogowski coil. Thus, the current measuring devices are configured to detect current in any component located radially inward of the aperture defined by the loop of the measuring device.

In some embodiments, the first current measuring device is mounted radially-outboard of the electrical pickup, and the second current measuring device is mounted radially-inboard of the electrical pickup.

The above-described arrangement of current measuring devices provides a useful mechanism for differentiating between stray current detected at the two radial locations. In particular, this arrangement enables a determination of the stray current produced by the generator rotor (and scavenged by the electrical pickup) to be carried out—this stray current will correspond to the difference between the current detected by the two devices. This thereby enables stray current diagnostic and protection measures to be implemented specifically in respect of the generator.

Optionally, the current measuring module further comprises a mounting disk. The electrical contact, and the first and second current measuring devices are configured to be mounted to the mounting disk. In some embodiments, the mounting disk is configured to be mounted to a housing of the gearbox. Providing the current measuring module in the above-described manner as an integrated unit, with all of the components being mounted to a mounting disk (and preferably one that substantially encircles the rotor), increases the ease of installation of the module in its desired location between the generator and gearbox.

In some embodiments, the electrical power generating assembly further comprises a control system in operative communication with the current measuring module, the control system configured to identify, based on the current detected by the first and/or second current measuring device, anomalies in the detected current. The current measuring module thereby facilitates the implementation of stray current diagnostic and protection measures in respect of various components of the electrical power generating assembly, particularly the generator.

In some embodiments, the electrical pickup comprises a brush module. Optionally, the brush module may comprise one or more linear brushes. In this case, the term 'linear' is used to indicate that individual elements forming the brush array (e.g. filaments or fibres) are arranged in a generally planar manner with respect to one another. In other words, the individual filament/fibre elements forming the brush array may be arranged generally parallel to one another, for example in a line along a channel provided in the brush component.

In such cases, the one or more linear brushes may extend along an axis that is generally aligned with a rotational axis of the rotor. However, in another embodiment, the dual current sensors may be combined with an electrical pickup that has brushes arranged in a radial direction relative to the rotor.

Optionally, the one or more linear brushes are carbon fibre brushes. Alternatively, other electrically conductive materials could also be used to form the individual brush elements, such as copper or brass wires or braids.

According to another aspect of the present invention, there is provided a wind turbine comprising the electrical power generating assembly substantially as described hereinabove. In particular, the wind turbine comprises a wind turbine tower, a nacelle rotatably coupled to the tower, a rotating hub mounted to the nacelle, and a plurality of wind turbine blades coupled to the hub. The nacelle comprises the electrical power generating assembly.

According to another aspect of the present invention, there is provided an electrical power generating assembly for a wind turbine. The electrical power generating assembly comprises a gearbox comprising a gearbox output shaft, a generator comprising a rotor that is coupled to the gearbox output shaft; and an electrical pickup mounted to the electrical power generating assembly. The electrical pickup comprises: a contact disk associated with and extending radially away from the generator rotor; and at least one electrical contact aligned with an axis of the generator rotor, and configured to be in electrical contact with an electrical contact surface of the contact disk so as to pick up current from components of the electrical power generating assembly.

Providing the above-described electrical pickup configuration is particularly advantageous as it facilitates blind integration of the electrical pickup assembly into its desired location between the generator and gearbox (the latter two components having already been installed within the nacelle prior to integration of the electrical pickup assembly). The axial orientation of the electrical contacts also increases the flexibility of the electrical pickup assembly for use with multiple different generators, each having a different rotor diameter. It will be appreciated that the above description of 'alignment' with the generator rotor axis should not be limited strictly to 'parallel alignment'. The electrical contacts may in fact be angled slightly with respect to the generator rotor axis, provided the required electrical contact with the contact disk is attained (i.e. provided the electrical contacts do not extend perpendicular to the generator rotor axis).

In some embodiments, the at least one electrical contact comprises a linear electrical brush array. Optionally, the electrical brush array comprises a plurality of brush fibres, extending in a direction aligned with (and preferably substantially parallel) to a rotational axis of the generator rotor, so as to interface with the electrical contact surface of the contact disk. The axially-oriented arrangement of the electrical contact brush array (in combination with the radially-extending contact disk) ensures good electrical connection between the electrical pickup and the rotor without requiring precise detailed alignment of the electrical contacts with the rotor (as might be required for axially-oriented contacts).

In some embodiments, the electrical contact is affixed to a mount associated with a housing of the gearbox.

The electrical contact pickup may comprise a first current measuring device mounted with respect to the electrical pickup to detect current flowing therethrough and/or a second current measuring device mounted with respect to the electrical pickup to detect current flowing through a component associated with the gearbox output shaft. In such embodiments, each of the first and second current measuring devices may comprise an elongate sensing element arranged to substantially encircle the generator rotor.

Optionally, the first current measuring device is mounted radially-outboard of the electrical pickup, and the second current measuring device is mounted radially-inboard of the electrical pickup.

According to another aspect of the present invention, there is provided a wind turbine comprising the electrical power generating assembly substantially as described hereinabove. In particular, the wind turbine comprises a wind turbine tower, a nacelle rotatably coupled to the tower, a rotating hub mounted to the nacelle, and a plurality of wind turbine blades coupled to the hub. The nacelle comprises the electrical power generating assembly.

Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

BRIEF DESCRIPTION OF THE DRAWINGS

The above and other aspects of the invention will now be described, by way of example only, with reference to the accompanying drawings, in which.

Figure 1:
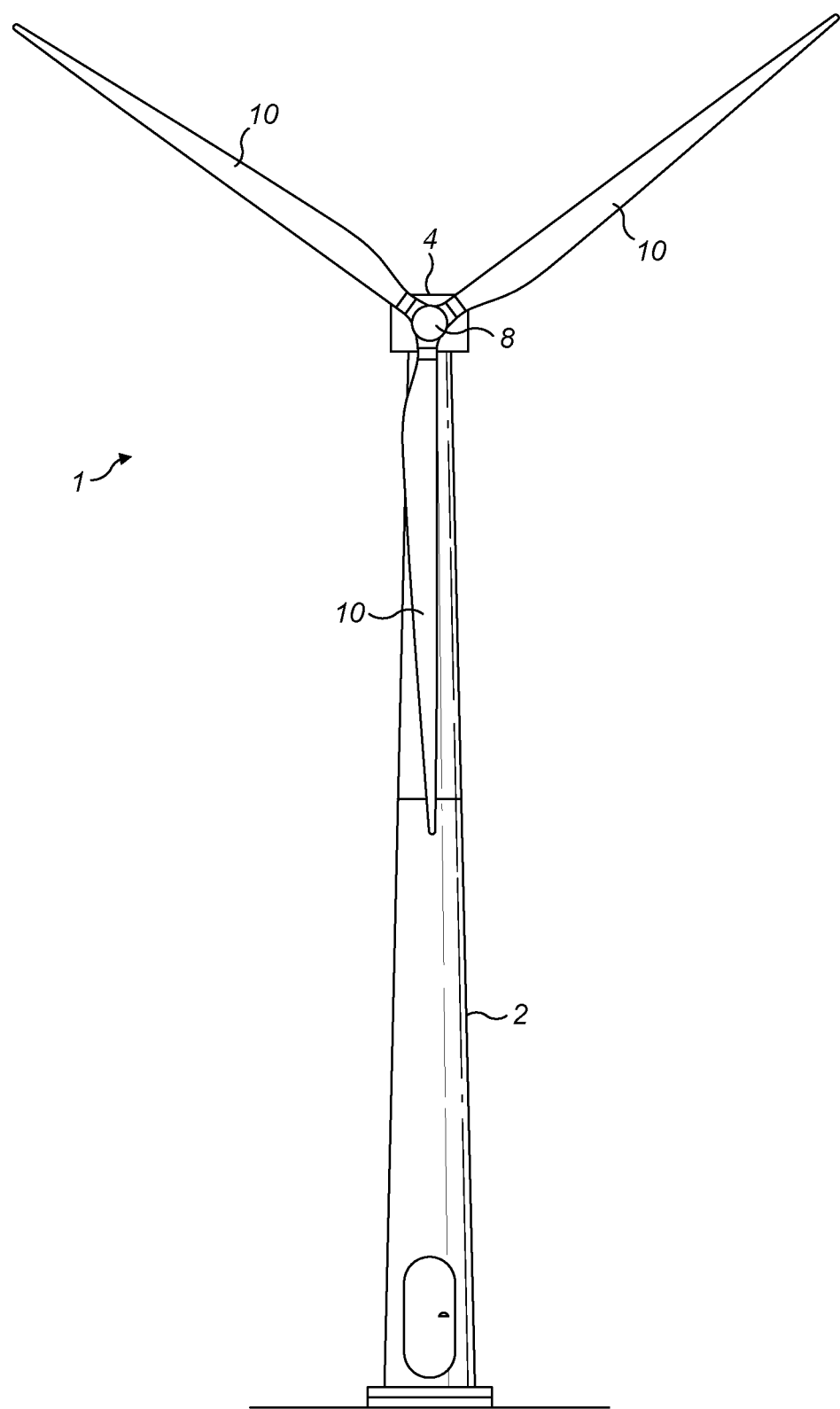
FIG. 1 is a schematic diagram of a wind turbine in which an electrical power generating assembly according to an embodiment of the present invention may be implemented.

In the drawings, like features are denoted by like reference signs.

SPECIFIC DESCRIPTION

A specific embodiment of the invention will now be described in which numerous features will be discussed in detail in order to provide a thorough understanding of the inventive concept as defined in the claims. However, it will be apparent to the skilled person that the invention may be put in to effect without the specific details and that in some instances, well known methods, techniques and structures have not been described in detail in order not to obscure the invention unnecessarily.

In order to place the embodiments of the invention in a suitable context, reference will firstly be made to FIG. 1, which illustrates a typical Horizontal Axis Wind Turbine (HAWT) in which an electrical power generating assembly according to an embodiment of the invention may be implemented. Although this particular image depicts an on-shore wind turbine, it will be understood that equivalent features will also be found on off-shore wind turbines. In addition, although the wind turbines are referred to as 'horizontal axis', it will be appreciated by the skilled person that for practical purposes, the axis is usually slightly inclined to prevent contact between the rotor blades and the wind turbine tower in the event of strong winds.

As previously mentioned, the wind turbine 1 comprises a tower 2, a nacelle 4 rotatably coupled to the top of the tower 2 by a yaw system (not shown), a rotating hub or 'rotor' 8 mounted to the nacelle 4 and a plurality of wind turbine rotor blades 10 coupled to the hub 8. The nacelle 4 and rotor blades 10 are turned and directed into the wind direction by the yaw system.

Figure 2:
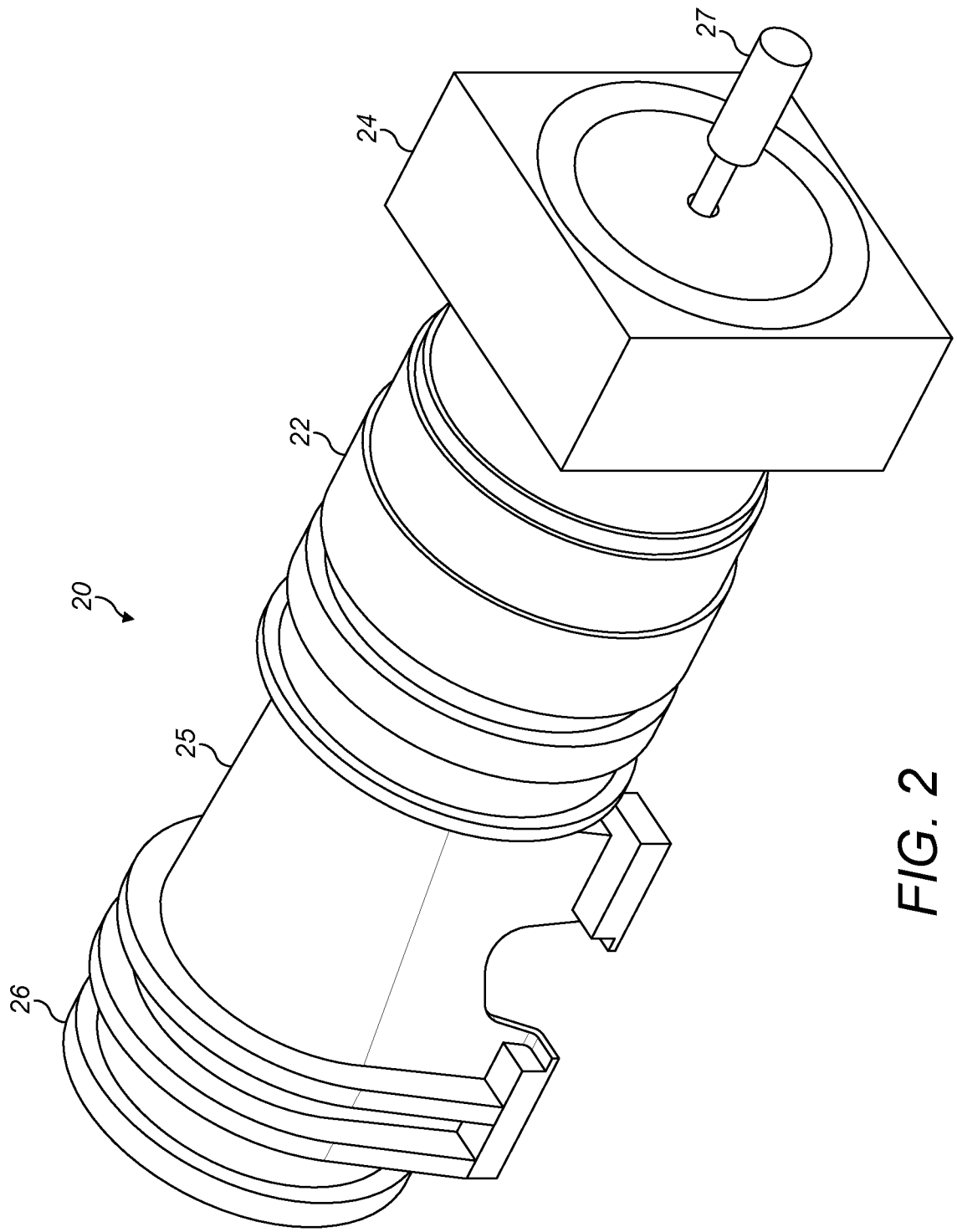
FIG. 2 is a schematic diagram of various functional power generating components located within the wind turbine nacelle of FIG. 1.

With reference to FIG. 2, the nacelle 4 may include an electrical power generating assembly 20, which includes a gearbox 22 and a generator 24. A main shaft 26, is supported by a main bearing housing 25 and is connected to, and driven by, the rotor 8 and provides input drive to the gearbox 22. The gearbox 22 steps up the rotational speed of the low speed main shaft 26 via internal gears (not shown) and drives a gearbox output shaft (not shown). The gearbox output shaft in turn drives the generator 24, which converts the rotation of the gearbox output shaft into electricity. The electricity generated by the generator 24 may then be converted by other components (not shown) as required before being supplied to an appropriate consumer, for example an electrical grid distribution system. So-called "direct drive" wind turbines that do not use gearboxes are also known. In a direct drive wind turbine, the generator is directly driven by a shaft connected to the rotor. A so called 'pitch tube' 27 may be arranged to pass along the centre of the generator 24 and the gearbox 22 to provide hydraulic services to the hub.

Figure 3:
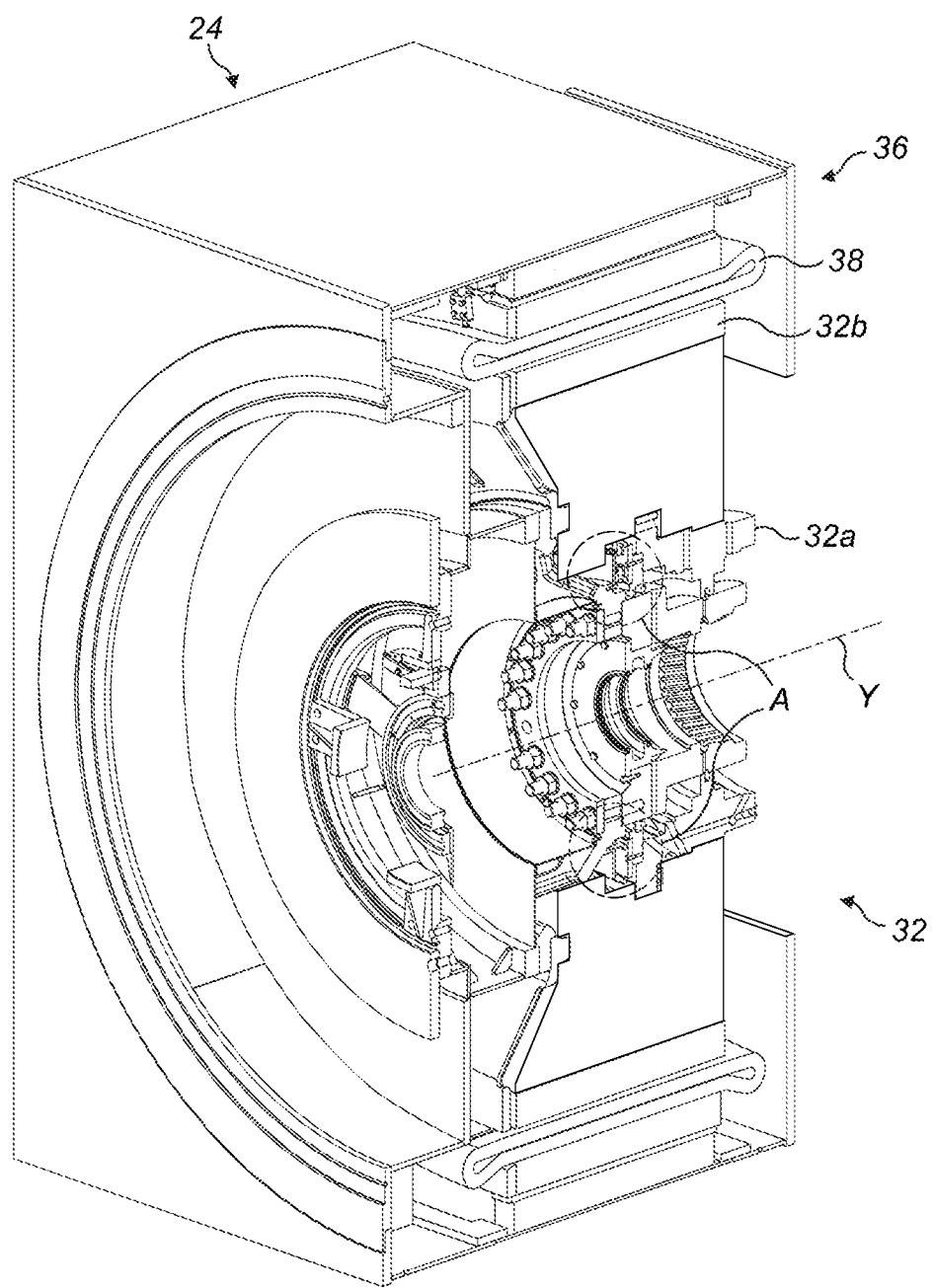
FIG. 3 is a sectional view of the generator shown in FIG. 2.

The gearbox 22 and generator 24 may be coupled together in an integrated unit to form the electrical power generating assembly 20. Such an integrated unit is shown in FIG. 2, whereas FIG. 3 shows a longitudinal section through the generator by way of a specific example, and as a separate sub assembly to the generator With reference generally to the gearbox 22, a gearbox housing 30 is generally cylindrical in form and is oriented such that its major rotational axis (indicated by the line 'Y' in FIG. 3) is horizontal, in the orientation of the drawings. The cylindrical configuration of the gearbox housing 30 is due to the specific type of gearbox that is used in the illustrated embodiment, which is an epicyclic gearbox. As the skilled person would know, an epicyclic gearbox comprises a series of planet gears that are arranged about a central sun gear, and which collectively are arranged within an encircling ring gear. The ratio of the number of teeth between the ring gear, the planet gear and the sun gears determines the gear ratio of the gearbox. For clarity, fine detail of the gearbox will not be described in further detail here as the gearbox is not the principal subject of the invention. Suffice to say that other gearbox configurations could also be used, although it is currently envisaged that an epicyclic gearbox provides an elegant solution fit for the confines of a wind turbine nacelle.

Turning now to the generator 24, the output shaft of the gearbox 22 interfaces with a rotor 32 of the generator 24, as can be seen particularly clearly in the section view of FIG. 3. The generator 24 in the illustrated embodiment is an IPM (interior permanent magnet) electric machine having an external stator 36 which surrounds the rotor 32. The rotor 32 includes a rotor shaft 32a which couples to a gearbox output shaft (not shown), and a radially out rotor core 32b which carries, support or other houses the permanent magnet elements of the rotor 32.

The stator 36 includes a stator core 38 which surrounds the rotor core 32b.

Figure 4:
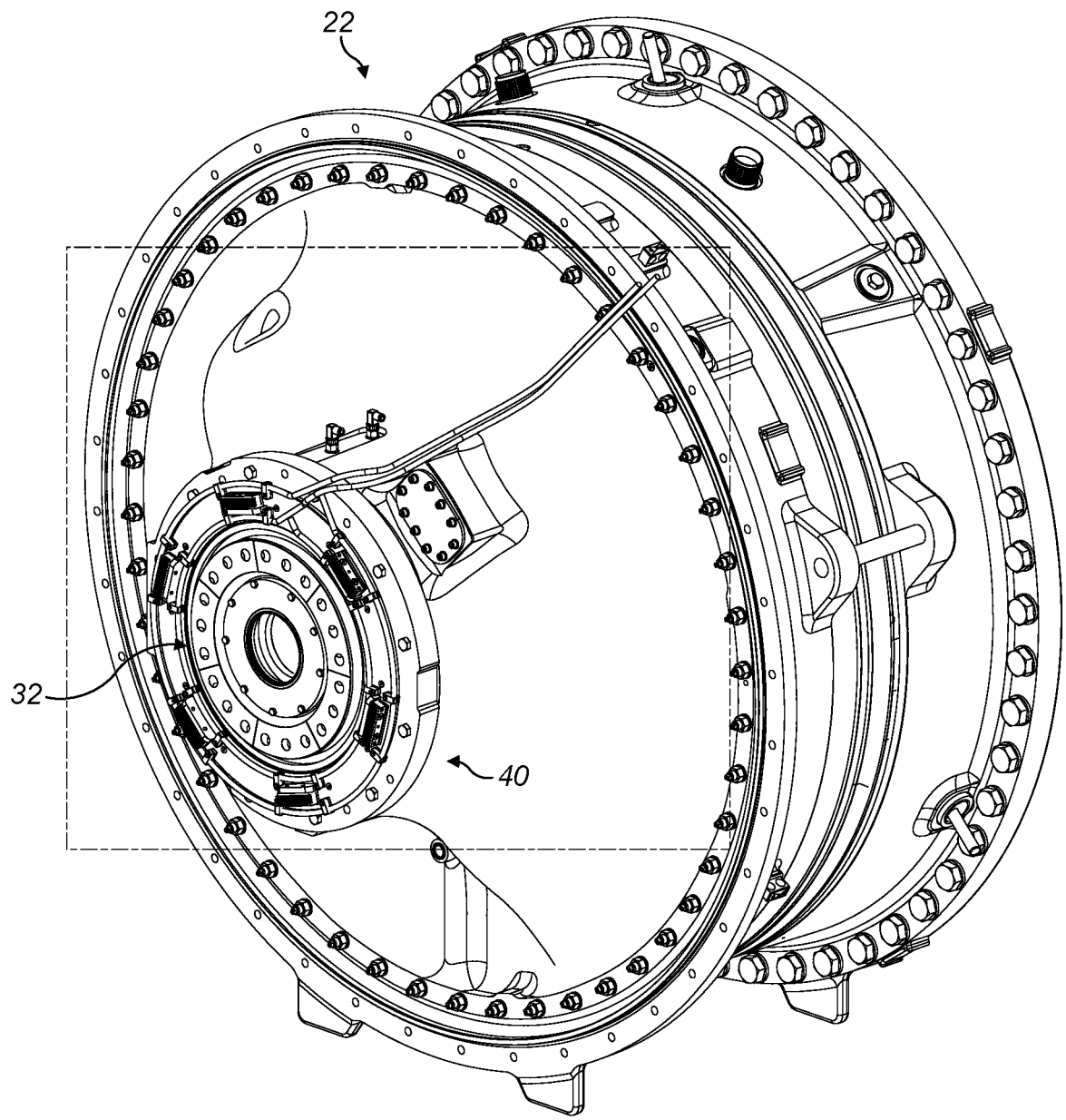
FIG. 4 is a perspective view of a portion of the gearbox and a portion of the rotor of the generator, illustrating the implementation and location of a current measuring module according to an embodiment of the present invention.

With reference to FIG. 4, a current measuring module 40 may be incorporated into the generator-gearbox integrated assembly, and is located between the gearbox and the generator. Specifically, the current measuring module 40 in the illustrated embodiment is associated with and interfaces with the generator rotor 32 It will be noted at this point that the current measuring module 40 is also shown in FIG. 3, and is highlighted by the circles labelled 'A'. However, FIG. 4 shows the current measuring module 40 in more detail for ease of understanding. The location and configuration of the current measuring module 40 are shown in greater detail in the close-up illustration of FIG. 5.

Figure 5:
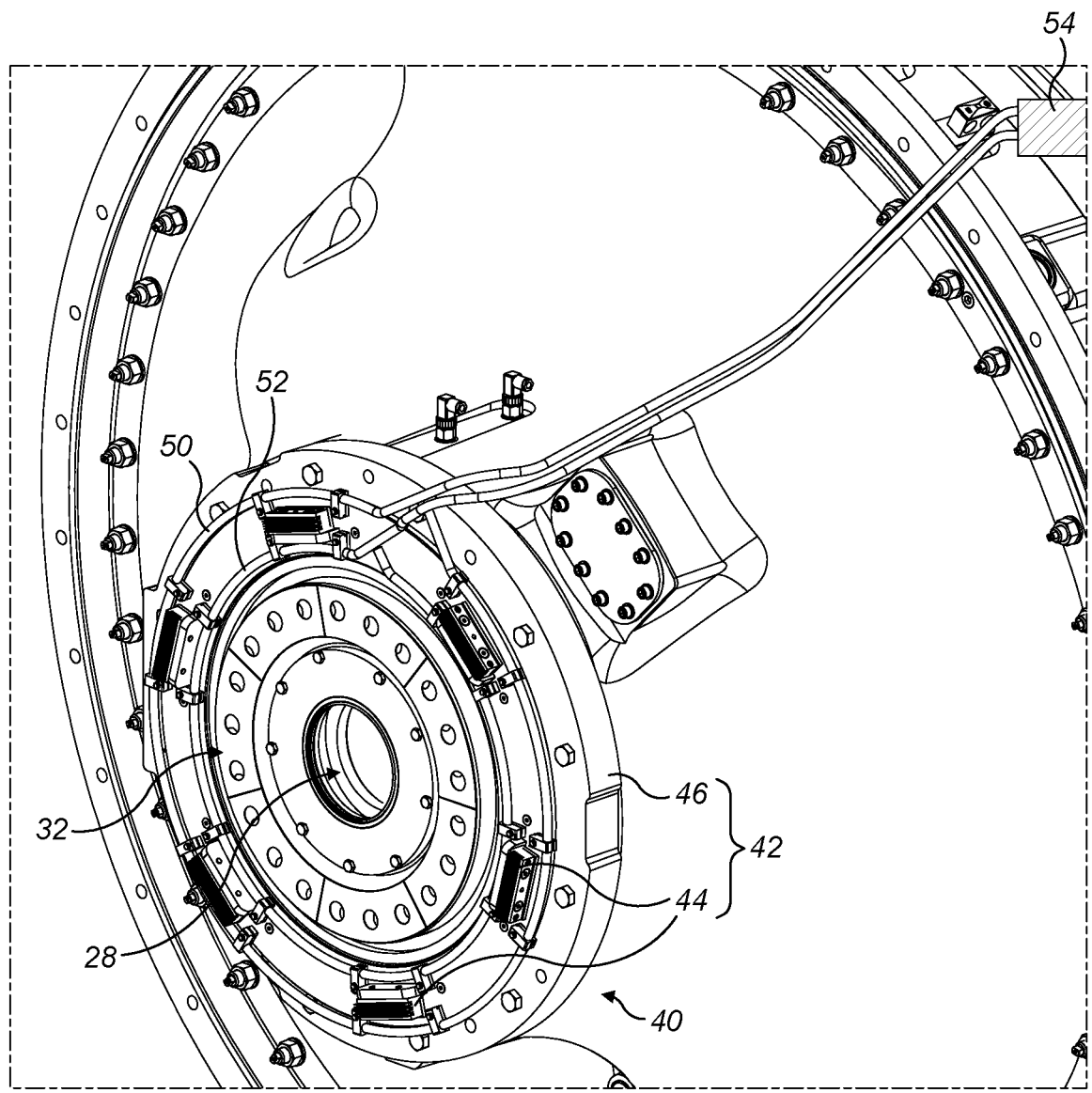
FIG. 5 is a close-up view of the arrangement of FIG. 4, showing details of the configuration of the current measuring module.
Figure 6:
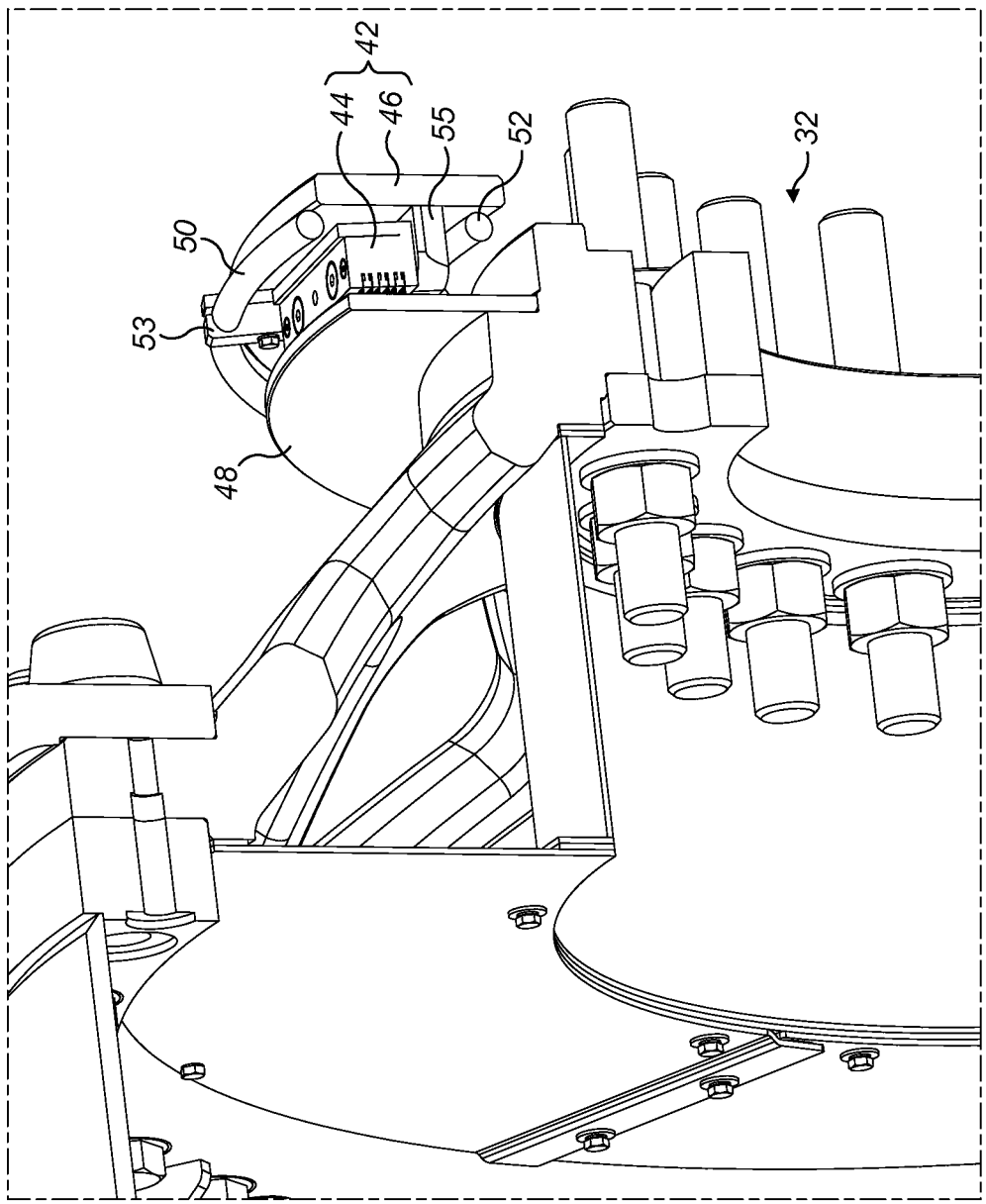
FIG. 6 is a perspective view, from a different viewing angle, of the current measurement module implemented on the generator rotor according to an embodiment of the present invention.

As may be seen in varying degrees of detail in FIGS. 4 to 6, the illustrated current measuring module 40 comprises an electrical pickup 42 which is arranged to scavenge 'stray current' induced in components of the generator 24. The electrical pickup 42 is mounted so as to be stationary with respect to the generator rotor 32 in use. In the illustrated embodiment, the electrical pickup 42 comprises a plurality of electrical contacts 44 that are mounted to a mounting disk or bracket 46 and arranged to encircle the gearbox output shaft and the generator rotor 32. Each of the electrical contacts 44 engages and interfaces with a flange or slip ring 48 that is associated with and extends radially away from the rotor 32. The electrical contacts are made of electrically conductive material (for example, carbon fibre or copper) and may take the form of electrical brush arrays. These are described in greater detail below.

The current measuring module 40 further comprises first and second current measuring devices 50, 52 which are configured to measure current flowing through components of the generator-gearbox integrated assembly. In the illustrated embodiment, the first and second current measuring devices 50, 52 each correspond to an elongate current-measuring element that substantially encircles the rotational axis of the generator 24. Specifically, each device 50, 52 is a Rogowski coil which, as the skilled person would be aware, is effectively a flexible current transformer that is arranged to enable monitoring and measurement of alternating current. As shown in FIG. 6 (and in greater detail in FIG. 7), the pair of current measuring Rogowski coils 50, 52 are mounted concentrically to the mounting disk 46, such that each coil 50, 52 extends in a loop between the electrical contacts 44 and substantially encircles the gearbox output shaft, and the radially inwards parts of the generator rotor 32. The Rogowski coils 50, 52 are mounted to the mounting disk 46 using fastening means 53 (such as clamps), and are positioned on radially opposing sides of the electrical contacts 44; in other words, the electrical contacts 44 are located in between the two coils 50, 52. This configuration provides a particular elegant and compact arrangement, but it is envisaged that the electrical contacts 44 could be arranged in a different location in some embodiments.

In the illustrated embodiment, each of the Rogowski coils 50, 52 is configured to monitor and measure the current induced in the component (or components) located radially-inboard of the Rogowski coil in question, that is to say the components that are encircled by the coils. Specifically, the first current measuring Rogowski coil 50 is mounted at a radially-outboard location on the mounting disk 46, relative to the electrical contacts 44, and is configured to measure the current induced in and flowing through the electrical contacts 44, and hence in electrical pickup 42 as a whole, in addition to the other components that are radially inwards of the coil 50. The second current measuring Rogowski coil 52 is mounted at a radially-inboard location on the mounting disk 46, relative to the electrical contacts 44, and is configured to measure the current induced in and flowing through components located radially-inboard of the electrical pickup 42, for example the gearbox output shaft and pitch tube 27 (not shown in FIGS. 4-6, but shown in FIG. 2), as well as the generator rotor 32.

Loose ends of the pair of Rogowski coils 50, 52 extend radially outwards away from the electrical pickup 42 to a connection or interface (indicated in FIG. 5 using arrows) with electronic conversion and control circuitry 54. This circuitry is configured to monitor and analyse the output signal from the Rogowski coils 50, 52 and may also comprise or be in operative communication with, for example, a generator control unit or system data bus that is configured to take action based on the measured 'stray current' values. For example, the difference in the currents measured by the pair of Rogowski coils 50, 52 will correspond to the 'stray current' accumulated in the electrical contacts 44 (e.g. from the generator rotor 32 and the pitch tube 28). The illustrated embodiment therefore enables diagnostics of the stray current levels in, for example, the generator 24, to be carried out. Furthermore, protective action may also be taken if the stray current value measured by one or both of the Rogowski coils 50, 52 exceeds a predetermined threshold. As a result, build-up of stray current in the generator 24 may be easily detected and protective measures implemented, thereby avoiding or mitigating any electrical arcing and associated damage that could result.

A close-up side perspective view highlighting additional details of the current measuring module 40 configuration is shown in FIG. 6; this view is taken vertically along a section of FIG. 5, perpendicularly through the axis of the mounting disk 46, but also shows further components to the left hand side of the current measuring module 40 that are not in FIG. 5.

FIG. 6 shows that the mounting disk 46 comprises a plurality of supports 55 in the form of shelves or ledges, each of which extends perpendicular to the annular main face of the mounting disk 46, and substantially parallel to the rotational axis of the generator 24. Each shelf 54 supports a corresponding one of the electrical contacts 44, the electrical contacts 44 being mounted to their respective support 55 by fastening means (not shown) such as bolts. In the illustrated embodiment, as previously mentioned, each electrical contact 44 takes the form of a generally linear electrical brush array comprising a plurality of brush filaments or fibres 56 which extend outwards, being aligned with and preferably substantially parallel to the rotational axis of the generator 24 (and also to the corresponding support 55), to interface with the slip ring 48 that is associated with the rotor 32. The term 'linear' is used here to indicate that the brush fibres 56 are arranged in a generally planar manner—for example, located parallel to one another along and within a linear channel provided in the electrical contact. It will be appreciated however that precise parallel alignment of the axially-extending brush fibres with respect to the rotational axis of the generator 24 is not required for the electrical connectivity between electrical contacts 44 and slip ring 48 to occur. The brush fibres 56 may be made of carbon fibre, or any suitable electrically conductive material such as copper or graphite.

It will be appreciated that the axially-extending alignment of the brush fibres 56, in combination with the provision of the radially-extending slip ring 48 associated with the rotor 32, is particularly advantageous. This is because it increases the flexibility of the illustrated electrical pickup 42 for use with a variety of generators having different rotor shaft diameters. In addition, it is noted that due to the size of the generator 24 and gearbox 22 assemblies, and the process of their installation within the wind turbine nacelle 4, the current measuring module 40 effectively needs to be incorporated into its desired location (between the gearbox 22 and the generator 24) via a 'blind assembly' process. The configuration of the electrical pickup utilised in embodiments of the invention increases the ease with which blind assembly may take place, whilst simultaneously ensuring that the brush fibres 56 (when installed in situ) will still have a good electrical connectivity with the generator rotor 32 via the slip ring 48; however the requirement to have a precise alignment of the brush fibres 56 with components such as the generator rotor 32 and/or main shaft 26 is obviated. The advantages of the illustrated configuration are particularly evident when considered in comparison with electrical pick-ups comprising a brush array in which the brush fibres extend radially inwards (e.g. as a ring around the rotational axis of the generator).

Many modifications may be made to the above examples without departing from the scope of the present invention as defined in the accompanying claims.

The invention claimed is:

1. An electrical power generating assembly for a wind turbine comprising:
  a gearbox comprising a gearbox output shaft,
  a generator comprising a rotor that is coupled to the gearbox output shaft; and
  a current measuring module located between the gearbox and the generator, the current measuring module comprising:
    an electrical pickup mounted to the electrical power generating assembly, wherein the electrical pickup includes an electrical contact that engages with a slip ring associated with the rotor;
    a first current measuring device mounted with respect to the electrical pickup to detect current flowing at least through the electrical pickup; and a second current measuring device mounted with respect to the electrical pickup to detect current flowing through at least a component associated with the gearbox output shaft, wherein the first current measuring device is mounted radially-outboard of the electrical pickup, and the second current measuring device is mounted radially-inboard of the electrical pickup.

2. The electrical power generating assembly of claim 1, wherein the current measuring module is provided as an integrated unit.

3. The electrical power generating assembly of claim 1, wherein each of the first and second current measuring devices comprises an elongate sensing element arranged to substantially encircle a generator rotor shaft.

4. The electrical power generating assembly of claim 1, wherein each of the first and second current measuring devices comprises a Rogowski coil.

5. The electrical power generating assembly of claim 1, further comprising a control system in operative communication with the current measuring module, wherein the control system is configured to identify, based on the current detected by the first and/or second current measuring device, anomalies in the detected current.

6. The electrical power generating assembly of claim 1, configured such that the difference in the currents measured by the first and second current measuring device corresponds to the 'stray current' accumulated in the electrical contact.

7. The electrical power generating assembly of claim 1, configured such that protective action is taken if the difference in the currents measured by the first and second current measuring device exceeds a predetermined threshold.

8. The electrical power generating assembly of claim 1, wherein the electrical pickup comprises a brush module.

9. The electrical power generating assembly of claim 8, wherein the brush module comprises one or more linear brushes.

10. The electrical power generating assembly of claim 9, wherein the one or more linear brushes extend along an axis that is generally aligned with a rotational axis of the rotor.

11. The electrical power generating assembly of claim 10, wherein the one or more linear brushes are carbon fibre brushes.

12. An electrical power generating assembly for a wind turbine comprising:
a gearbox comprising a gearbox output shaft,
a generator comprising a rotor that is coupled to the gearbox output shaft; and
a current measuring module located between the gearbox and the generator, the current measuring module comprising:
an electrical pickup mounted to the electrical power generating assembly, wherein the electrical pickup includes an electrical contact that engages with a slip ring associated with the rotor;
a first current measuring device mounted with respect to the electrical pickup to detect current flowing at least through the electrical pickup; and
a second current measuring device mounted with respect to the electrical pickup to detect current flowing through at least a component associated with the gearbox output shaft,
wherein the current measuring module further comprises a mounting disk, and wherein the electrical contact, and the first and second current measuring devices are configured to be mounted to the mounting disk.

13. The electrical power generating assembly of claim 12, wherein the mounting disk is mounted to a housing of the gearbox.

14. A wind turbine comprising a wind turbine tower, a nacelle rotatably coupled to the tower, a rotating hub mounted to the nacelle, and a plurality of wind turbine blades coupled to the hub, wherein the nacelle comprises the electrical power generating assembly of claim 1.

* * * * *